(12) United States Patent
Xu et al.

(10) Patent No.: US 11,815,757 B2
(45) Date of Patent: Nov. 14, 2023

(54) LIQUID CRYSTAL DISPLAY PANEL

(71) Applicant: TCL CHINA STAR OPTOELECTRONICS TECHNOLOGY CO., LTD., Shenzhen (CN)

(72) Inventors: Yue Xu, Shenzhen (CN); Yani Chen, Shenzhen (CN); Jinjie Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 118 days.

(21) Appl. No.: 17/426,474

(22) PCT Filed: Jun. 22, 2021

(86) PCT No.: PCT/CN2021/101382
§ 371 (c)(1),
(2) Date: Jul. 28, 2021

(87) PCT Pub. No.: WO2022/183630
PCT Pub. Date: Sep. 9, 2022

(65) Prior Publication Data
US 2023/0142658 A1    May 11, 2023

(30) Foreign Application Priority Data
Mar. 1, 2021   (CN) .......................... 202110227442.X

(51) Int. Cl.
G02F 1/1343   (2006.01)
G02F 1/1335   (2006.01)
(Continued)

(52) U.S. Cl.
CPC .... G02F 1/133512 (2013.01); G02F 1/13306 (2013.01); G02F 1/133514 (2013.01);
(Continued)

(58) Field of Classification Search
CPC ........... G02F 1/133512; G02F 1/13306; G02F 1/134309; G02F 1/136286; G02F 1/136209; H01L 27/124
See application file for complete search history.

(56) References Cited

U.S. PATENT DOCUMENTS

2008/0036355 A1   2/2008   Chan et al.
2009/0180065 A1   7/2009   Chan et al.
(Continued)

FOREIGN PATENT DOCUMENTS

CN   104375340 A   2/2015
CN   105116603 A   12/2015
(Continued)

OTHER PUBLICATIONS

CN 110346987 translation (Year: 2019).*

*Primary Examiner* — James A Dudek
(74) *Attorney, Agent, or Firm* — The Roy Gross Law Firm, LLC; Roy Gross

(57) ABSTRACT

A liquid crystal display panel is provided. The liquid crystal display panel includes a drive circuit layer and a plurality of pixel electrodes disposed on the drive circuit layer. The drive circuit layer includes a first metal layer and a second metal layer, each of the pixel electrodes is electrically connected to the second metal layer by a through-hole and includes a first main trunk electrode and a second main trunk electrode, and the second main trunk electrode includes an upper electrode adjacent to the through-hole. The liquid crystal display panel further includes a shielding member for shielding a display area where the upper electrode is located.

19 Claims, 6 Drawing Sheets

(51) Int. Cl.
*G02F 1/133* (2006.01)
*G02F 1/1362* (2006.01)
*H01L 27/12* (2006.01)

(52) U.S. Cl.
CPC .. *G02F 1/134309* (2013.01); *G02F 1/136286* (2013.01); *H01L 27/124* (2013.01); *G02F 2201/123* (2013.01)

(56) References Cited

U.S. PATENT DOCUMENTS

| | | | |
|---|---|---|---|
| 2012/0050656 A1 | 3/2012 | Liu et al. | |
| 2014/0267996 A1* | 9/2014 | Kim | G02F 1/134309 349/144 |
| 2018/0088409 A1* | 3/2018 | Lee | H10K 71/50 |

FOREIGN PATENT DOCUMENTS

| | | |
|---|---|---|
| CN | 105527763 A | 4/2016 |
| CN | 107238990 A | 10/2017 |
| CN | 107870470 A | 4/2018 |
| CN | 109613774 A | 4/2019 |
| CN | 109634012 A | 4/2019 |
| CN | 110346987 A | 10/2019 |
| CN | 110928094 A | 3/2020 |
| CN | 111240105 A | 6/2020 |
| CN | 111240106 A | 6/2020 |
| CN | 112859403 A | 5/2021 |

* cited by examiner

LIQUID CRYSTAL DISPLAY PANEL

CROSS REFERENCE TO RELATED APPLICATIONS

The present application is a National Phase of PCT Patent Application No. PCT/CN2021/101382 having International filing date of Jun. 22, 2021, which claims priority of the Chinese patent application No. 202110227442.X filed on Mar. 1, 2021 with the National Intellectual Property Administration, titled "Liquid crystal display panel", the contents of which are all incorporated herein by reference in their entirety.

FIELD OF INVENTION

The present disclosure relates to the field of display technologies, and more particularly, to a liquid crystal display panel.

BACKGROUND OF INVENTION

Liquid crystal displays are current mainstream display technology. With changes of market demands, liquid crystal display devices are developing toward large sizes and high resolution. However, with continuous increases in sizes and resolution of the liquid crystal display devices, many problems are gradually emerging.

The liquid crystal display devices use electric fields provided by pixel electrodes and common electrodes together to control deflection angles of liquid crystals, thereby realizing different grayscale displays. The pixel electrodes have main trunk areas and branch areas. Electric field forces generated in the main trunk areas of the pixel electrodes are weaker, so when the liquid crystals have deflection disorder under an external force, a restored speed of the liquid crystals positioned in the main trunk areas of the pixel electrodes is relatively slower. In addition, the pixel electrodes are connected to wirings in lower layers by through-holes, and existence of the through-holes causes electric field forces adjacent to the through-holes to be smaller than electric field forces in non-through-hole areas. Under effects of the above two factors, the electric field forces undergone by the liquid crystals adjacent to the through-holes and in the main trunk areas of the pixel electrodes are significantly smaller than that of other areas, which causes the liquid crystals in this area to have a slow speed to restore from a disordered state to an ordered state under the electric fields. Therefore, an afterimage problem occurs on display pictures.

Technical problem: current liquid crystal display devices have the afterimage problem caused by the liquid crystals adjacent to the through-holes and in the main trunk areas of the pixel electrodes having the slow speed to restore from the disordered state to the ordered state.

SUMMARY OF INVENTION

The present disclosure provides a liquid crystal display panel to solve a technical problem of afterimages in main trunk areas of pixel electrodes adjacent to through-holes in current liquid crystal display devices.

The present disclosure provides a liquid crystal display panel, which includes a plurality of scanning lines extending along a first direction and a plurality of data lines extending along a second direction, and the liquid crystal display panel further includes:

a drive circuit layer including a first metal layer and a second metal layer;

a plurality of pixel electrodes disposed on the drive circuit layer, wherein, each of the pixel electrodes is electrically connected to the second metal layer by a through-hole and includes a first main trunk electrode and a second main trunk electrode, and the second main trunk electrode includes an upper electrode adjacent to the through-hole; and a shielding member, wherein, an orthographic projection of the shielding member on the pixel electrodes coincides with the upper electrode.

In the liquid crystal display panel of the present disclosure, the first metal layer includes the scanning lines; and the shielding member includes a first shielding metal positioned in the first metal layer.

In the liquid crystal display panel of the present disclosure, the first shielding metal is insulated from the scanning lines.

In the liquid crystal display panel of the present disclosure, the second metal layer includes the data lines; and the shielding member includes a second shielding metal positioned in the second metal layer.

In the liquid crystal display panel of the present disclosure, the second shielding metal is insulated from the data lines.

In the liquid crystal display panel of the present disclosure, the liquid crystal display panel further includes a plurality of color resists corresponding to the pixel electrodes by one to one;

wherein, the color resists include a first color resist and a second color resist arranged adjacent to each other along the second direction, a light-shielding layer is disposed between the first color resist and the second color resist, and the shielding member is positioned in the light-shielding layer.

In the liquid crystal display panel of the present disclosure, the shielding member is connected to the light-shielding layer.

In the liquid crystal display panel of the present disclosure, a width of the shielding member is greater than or equal to a width of the upper electrode.

In the liquid crystal display panel of the present disclosure, the shielding member is perpendicular to the light-shielding layer.

In the liquid crystal display panel of the present disclosure, the light-shielding layer and the shielding member are combined to form a T-shaped light-shielding structure.

In the liquid crystal display panel of the present disclosure, the second main trunk electrode further includes a lower electrode away from the through-hole, and the lower electrode is electrically connected to the upper electrode; and a projection of the shielding member on the pixel electrodes along a direction perpendicular to a plane that the pixel electrodes are located coincides with the lower electrode.

In the liquid crystal display panel of the present disclosure, a width of the shielding member is greater than or equal to a width of the lower electrode.

In the liquid crystal display panel of the present disclosure, the shielding member is parallel to the data lines.

In the liquid crystal display panel of the present disclosure, the shielding member is positioned between two adjacent data lines.

In the liquid crystal display panel of the present disclosure, the shielding member is perpendicular to the scanning lines.

In the liquid crystal display panel of the present disclosure, the shielding member is positioned between two adjacent scanning lines.

In the liquid crystal display panel of the present disclosure, each of the pixel electrodes further includes a plurality of branch electrodes, and the branch electrodes, the first main trunk electrode, and the second main trunk electrode form a pozidriv structure.

In the liquid crystal display panel of the present disclosure, the liquid crystal display panel includes an array substrate, a color filter substrate disposed opposite to the array substrate, and liquid crystals disposed between the array substrate and the color filter substrate;

wherein, the array substrate includes the drive circuit layer and the pixel electrodes, and the pixel electrodes are disposed on one side of the drive circuit layer adjacent to the liquid crystals.

In the liquid crystal display panel of the present disclosure, the color filter substrate includes color resists and a common electrode, the common electrode is disposed on one side of the color resists adjacent to the liquid crystals, and the color resists correspond to the pixel electrodes by one to one.

The present disclosure further provides a liquid crystal display panel, which includes an array substrate, a color filter substrate disposed opposite to the array substrate, and liquid crystals disposed between the array substrate and the color filter substrate;

wherein, the array substrate includes:

a drive circuit layer including a first metal layer and a second metal layer, wherein, the first metal layer includes a plurality of scanning lines extending along a first direction, and the second metal layer includes a plurality of data lines extending along a second direction;

a plurality of pixel electrodes disposed on the drive circuit layer, wherein, each of the pixel electrodes is electrically connected to the second metal layer by a through-hole and includes a first main trunk electrode and a second main trunk electrode, and the second main trunk electrode is parallel to the data lines; and a shielding member disposed in the first metal layer or the second metal layer, wherein, an orthographic projection of the shielding member on the pixel electrodes coincides with the second main trunk electrode.

Beneficial effect: the present disclosure provides the liquid crystal display panel. The liquid crystal display panel includes the drive circuit layer and the plurality of pixel electrodes disposed on the drive circuit layer. The drive circuit layer includes the first metal layer and the second metal layer, each of the pixel electrodes is electrically connected to the second metal layer by the through-hole and includes the first main trunk electrode and the second main trunk electrode, and the second main trunk electrode includes the upper electrode adjacent to the through-hole. The liquid crystal display panel further includes the shielding member for shielding a display area where the upper electrode is located. The present disclosure disposes the shielding member to shield light in the display area corresponding to the upper electrode of the liquid crystal display panel, which allows afterimages in the display area corresponding to the upper electrode not to be shown. Therefore, afterimage defects on display pictures in this area can be eliminated, and display quality of the liquid crystal display panel can be improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
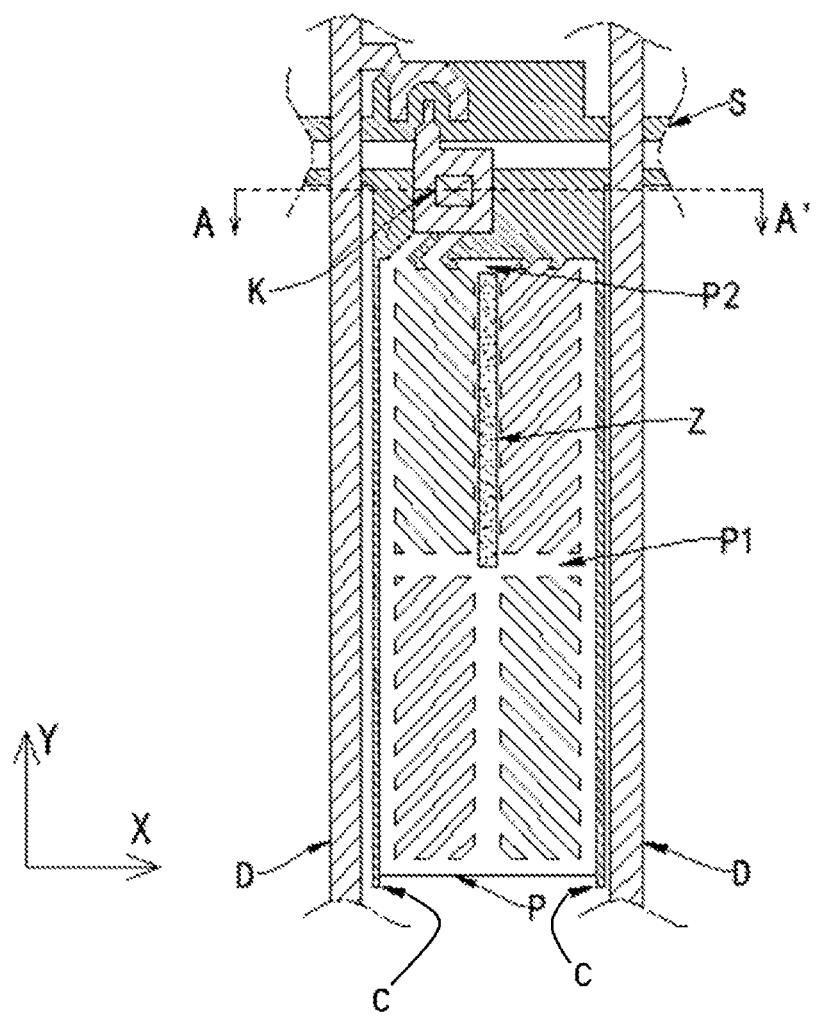
FIG. 1 is a perspective view of a single pixel electrode area of a liquid crystal display panel according to a first embodiment of the present disclosure.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

An embodiment of the present disclosure provides a liquid crystal display panel. The liquid crystal display panel includes a drive circuit layer and a plurality of pixel electrodes disposed on the drive circuit layer. The drive circuit layer includes a first metal layer and a second metal layer, each of the pixel electrodes is electrically connected to the second metal layer by a through-hole and includes a first main trunk electrode and a second main trunk electrode, and the second main trunk electrode includes an upper electrode adjacent to the through-hole. The liquid crystal display panel further includes a shielding member for shielding a display area where the upper electrode is located. The present disclosure disposes the shielding member to shield light in the display area corresponding to the upper electrode of the liquid crystal display panel, which allows afterimages in the display area corresponding to the upper electrode not to be shown. Therefore, display quality of the liquid crystal display panel can be improved.

Figure 2:
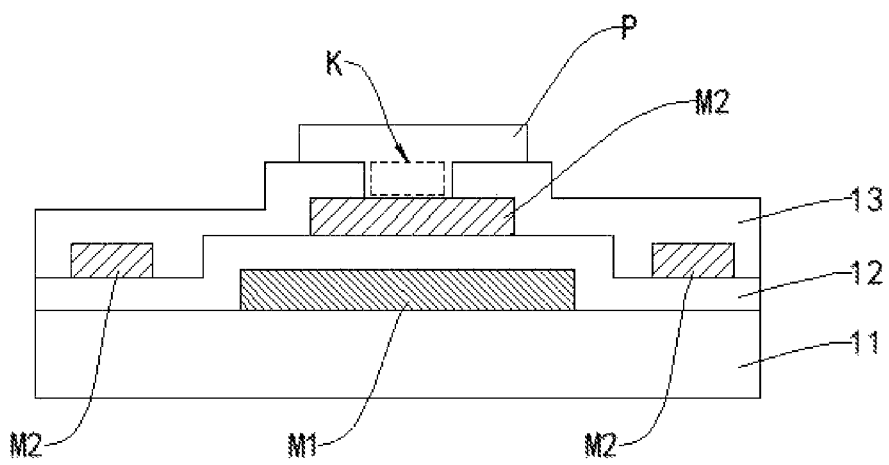
FIG. 2 is a schematic cross-sectional structural diagram of the liquid crystal display panel shown in FIG. 1 along line A-A'.

Referring to FIGS. 1 and 2, FIG. 1 is a perspective view of a single pixel electrode area of the liquid crystal display panel according to a first embodiment of the present disclosure, and FIG. 2 is a schematic cross-sectional structural diagram of the liquid crystal display panel shown in FIG. 1 along line A-A'. Wherein, the perspective view of FIG. 1 only shows scanning lines, data lines, a pixel electrode, and the shielding member included in the liquid crystal display panel, so as to illustrate relative positional relationships between them.

The liquid crystal display panel includes a plurality of scanning lines S extending along a first direction X and a plurality of data lines D extending along a second direction Y. The scanning lines S are configured to provide scanning control signals, and the data lines D are configured to provide data signals. Optionally, the first direction X and the second direction Y are two directions perpendicular to each other. The data lines D are arranged along the first direction X, and the scanning lines S are arranged along the second direction Y.

The liquid crystal display panel further includes the drive circuit layer, and the drive circuit layer includes a substrate 11, the first metal layer M1 disposed on the substrate 11, a first insulating layer 12 covering the first metal layer M1, the second metal layer M2 disposed on the first insulating layer 12, and a second insulating layer 13 covering the second metal layer M2. Wherein, the first metal layer M1 and the second metal layer M2 are both film layers provided with metal wirings, the scanning lines S are located in the first metal layer M1, and the data lines D are located in the second metal layer M2.

The drive circuit layer also includes a plurality of thin film transistors. A gate electrode of the thin film transistors is positioned in the first metal layer M1 and is electrically connected to the scanning lines S. A source electrode and a drain electrode of the thin film transistors are positioned in the second metal layer M2, and the source electrode of the thin film transistors is electrically connected to the data lines D.

The liquid crystal display panel further includes the pixel electrode P disposed on the drive circuit layer, and the pixel electrode P is electrically connected to the second metal layer M2 by the through-hole K on the second insulating layer 13. Specifically, the pixel electrode P is electrically connected to the drain electrode of the thin film transistors by the through-hole K. Scanning signals provided by the scanning lines S control the source electrode and the drain electrode of the thin film transistors to be conducted to each other, and the data signals provided by the data lines D to the source electrode are transmitted to the pixel electrode P by the source electrode and the drain electrode, thereby allowing the pixel electrode P to generate a specific electric field effect.

The pixel electrode P includes the first main trunk electrode P1 and the second main trunk electrode P2. Optionally, the first main trunk electrode P1 extends along the first direction X, and the second main trunk electrode P2 extends along the second direction Y. The first main trunk electrode P1 and the second main trunk electrode P2 are connected crosswise to form a plurality of pixel electrode sub-areas. Each of the pixel electrode sub-areas includes a plurality of branch electrodes, and the branch electrodes and the first main trunk electrode P1 or the second main trunk electrode P2 have a certain tilt angle, thereby allowing the pixel electrode P to have a pozidriv structure.

Taking an intersection of the first main trunk electrode P1 and the second main trunk electrode P2 as a boundary, the second main trunk electrode P2 may be divided into the upper electrode and a lower electrode. The upper electrode is adjacent to the through-hole K, and the lower electrode is farther away from the through-hole K than the upper electrode.

The liquid crystal display panel further includes the shielding member Z, the shielding member Z is disposed corresponding to the upper electrode, and an orthographic projection of the shielding member Z on the pixel electrode P coincides with the upper electrode.

Further, the shielding member Z is parallel to the data lines D and is positioned between two adjacent data lines D.

The shielding member Z may be positioned on an upper layer of the pixel electrode P, or may be positioned on a lower layer of the pixel electrode P. The shielding member Z may be a shielding metal in the first metal layer M1 or in the second metal layer M2, or a film layer having a light-shielding function positioned in other structural layers.

A width of the shielding member Z is greater than or equal to a width of the upper electrode. The shielding member Z plays a role of shielding light emitted from the liquid crystal display panel corresponding to an upper electrode area, thereby allowing this area not to display pictures. Therefore, afterimage defects appeared in this area can be eliminated, and the display quality of the liquid crystal display panel can be improved.

Figure 3:
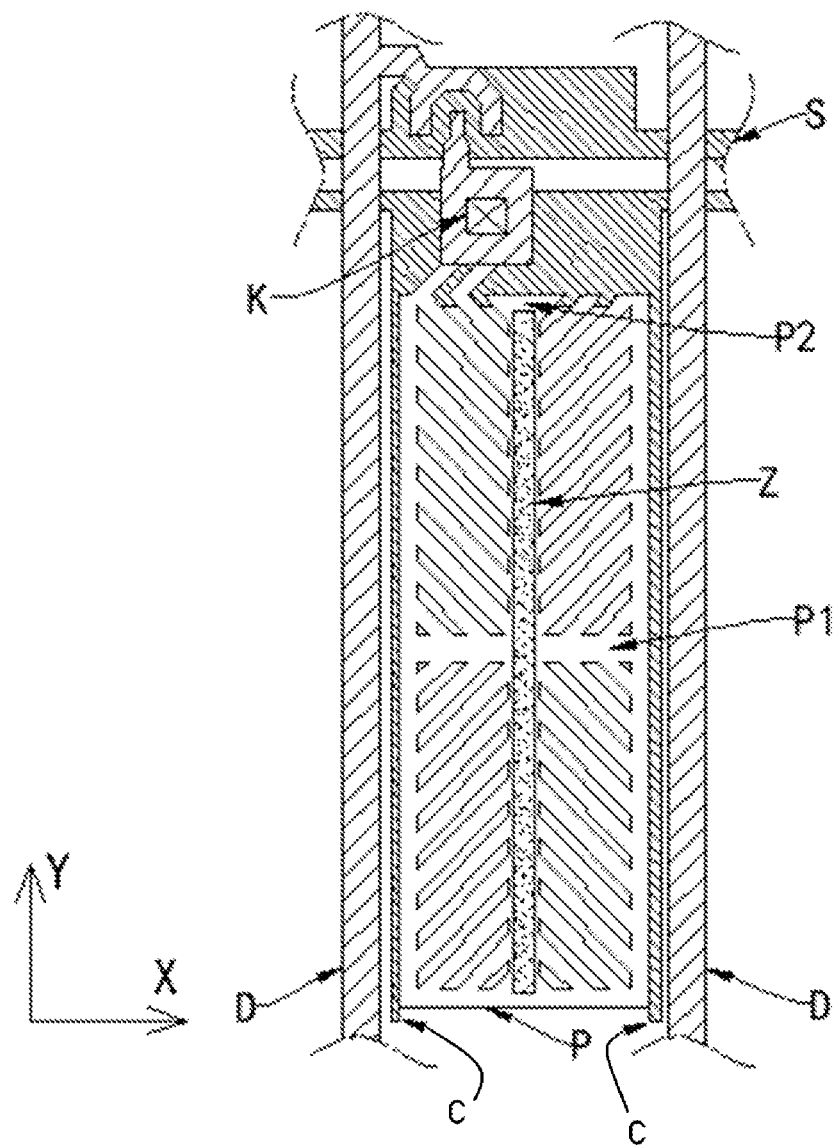
FIG. 3 is a perspective view of the single pixel electrode area of the liquid crystal display panel according to a second embodiment of the present disclosure.

In an embodiment, referring to FIG. 3, FIG. 3 is a perspective view of the single pixel electrode area of the liquid crystal display panel according to a second embodiment of the present disclosure. Wherein, the perspective view of FIG. 3 only shows the scanning lines, the data lines, the pixel electrode, and the shielding member included in the liquid crystal display panel, so as to illustrate the relative positional relationships between them.

The liquid crystal display panel shown in FIG. 3 and the liquid crystal display panel shown in FIG. 1 have same or similar structures. Structural features of the liquid crystal display panel shown in FIG. 3 will be described below. For the parts that are not described in detail, please refer to the description of the structure of the liquid crystal display panel shown in FIG. 1 above.

The liquid crystal display panel includes the scanning lines S extending along the first direction X and the data lines D extending along the second direction Y. The first direction X and the second direction Y are the two directions perpendicular to each other. The data lines D are arranged along the first direction X, and the scanning lines S are arranged along the second direction Y.

The liquid crystal display panel further includes the drive circuit layer, and the drive circuit layer includes the first metal layer and the second metal layer. The first metal layer and the second metal layer are both film layers provided with metal wirings, the scanning lines S are located in the first metal layer, and the data lines D are located in the second metal layer.

The drive circuit layer also includes the thin film transistors. The gate electrode of the thin film transistors is positioned in the first metal layer and is electrically connected to the scanning lines S. The source electrode and the drain electrode of the thin film transistors are positioned in the second metal layer, and the source electrode of the thin film transistors is electrically connected to the data lines D.

The liquid crystal display panel further includes the pixel electrode P disposed on the drive circuit layer, and the pixel electrode P is electrically connected to the second metal layer by the through-hole K. The pixel electrode P includes the first main trunk electrode P1 extending along the first direction X and the second main trunk electrode P2 extending along the second direction Y. The first main trunk electrode P1 and the second main trunk electrode P2 are connected crosswise to form the pixel electrode sub-areas. Each of the pixel electrode sub-areas includes the branch electrodes, and the branch electrodes and the first main trunk electrode P1 or the second main trunk electrode P2 have the certain tilt angle, thereby allowing the pixel electrode P to have the pozidriv structure.

Taking the intersection of the first main trunk electrode P1 and the second main trunk electrode P2 as the boundary, the second main trunk electrode P2 may be divided into the upper electrode and the lower electrode. The upper electrode is adjacent to the through-hole K, and the lower electrode is farther away from the through-hole K than the upper electrode.

The liquid crystal display panel further includes the shielding member Z, the shielding member Z is disposed corresponding to the upper electrode and the lower electrode, and the orthographic projection of the shielding member Z on the pixel electrode P coincides with the upper electrode and the lower electrode.

Further, the shielding member Z is parallel to the data lines D and is positioned between the two adjacent data lines D.

Further, the shielding member Z is disposed corresponding to the second main trunk electrode P2, and a projection of the shielding member Z on the pixel electrode P along a direction perpendicular to a plane where the pixel electrode P is located coincides with the second main trunk electrode P2. Therefore, the light emitted from the liquid crystal display panel corresponding to the second main trunk electrode P2 can be completely shielded by the shielding member Z, thereby eliminating the afterimage defects appeared in this area.

Further, the shielding member Z may be positioned on the upper layer of the pixel electrode P, or may be positioned on the lower layer of the pixel electrode P. The shielding member Z may be the shielding metal in the first metal layer M1 or in the second metal layer M2, or the film layer having the light-shielding function positioned in the other structural layers.

The width of the shielding member Z is greater than or equal to a width of the second main trunk electrode P2. The shielding member Z plays a role of shielding the light emitted from the liquid crystal display panel corresponding to a second main trunk electrode P2 area, thereby allowing this area not to display pictures. Therefore, the afterimage defects appeared in this area can be eliminated, and the display quality of the liquid crystal display panel can be improved.

Figure 4:
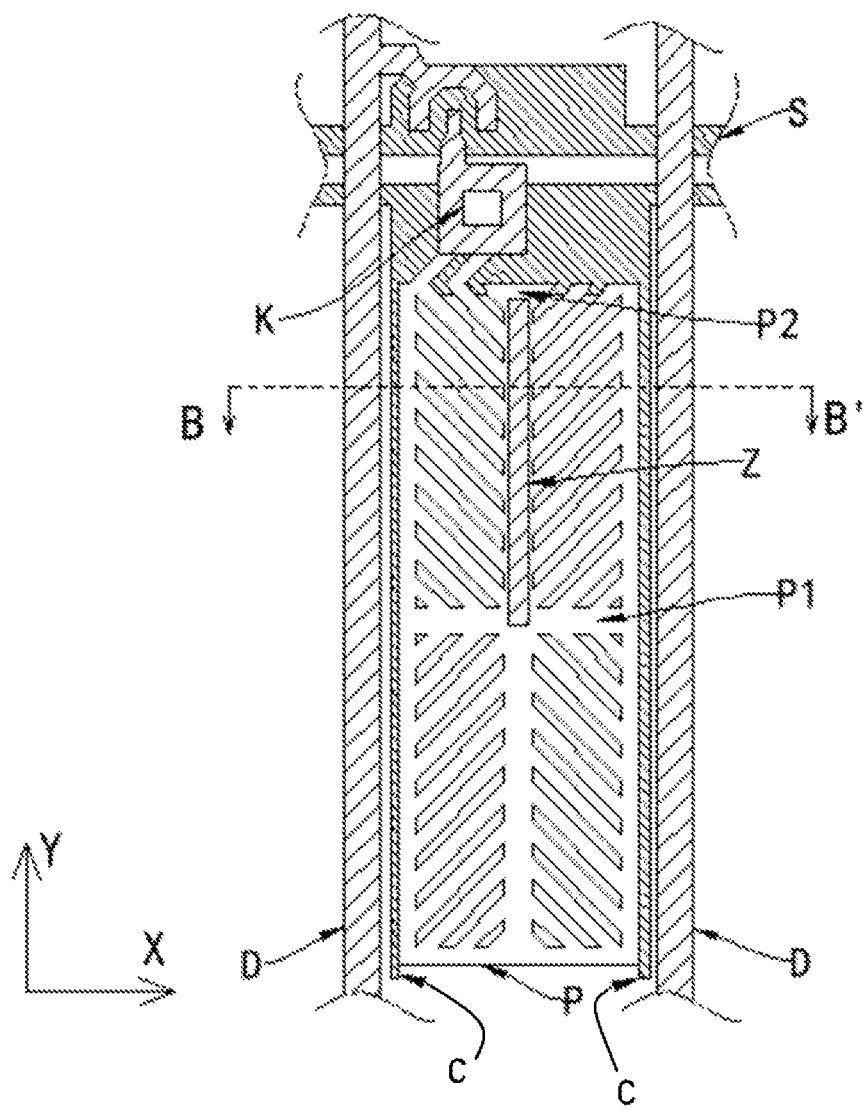
FIG. 4 is a perspective view of the single pixel electrode area of the liquid crystal display panel according to a third embodiment of the present disclosure.
Figure 5:
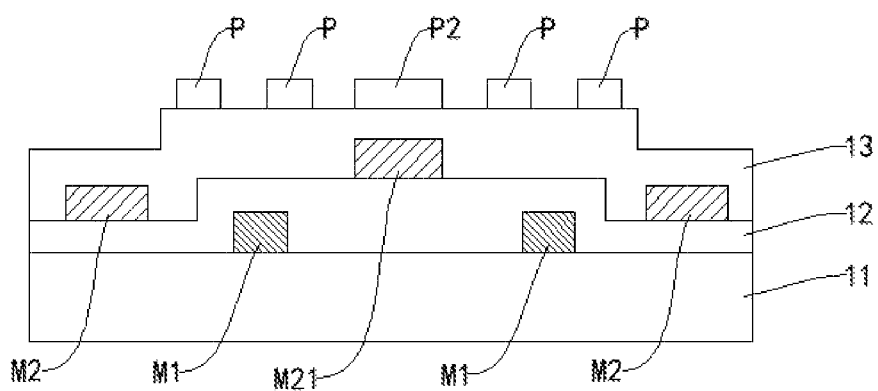
FIG. 5 is a schematic cross-sectional structural diagram of the liquid crystal display panel shown in FIG. 4 along line B-B'.

In an embodiment, referring to FIGS. 4 and 5, FIG. 4 is a perspective view of the single pixel electrode area of the liquid crystal display panel according to a third embodiment of the present disclosure, and FIG. 5 is a schematic cross-sectional structural diagram of the liquid crystal display panel shown in FIG. 4 along line B-B'. Wherein, the perspective view of FIG. 4 only shows the scanning lines, the data lines, the pixel electrode, and the shielding member included in the liquid crystal display panel, so as to illustrate the relative positional relationships between them.

The liquid crystal display panel shown in FIG. 4 and the liquid crystal display panel shown in FIG. 1 have same or similar structures. Structural features of the liquid crystal display panel shown in FIG. 4 will be described below. For the parts that are not described in detail, please refer to the description of the liquid crystal display panel shown in FIG. 1 above.

The liquid crystal display panel includes the scanning lines S extending along the first direction X and the data lines D extending along the second direction Y. The scanning lines S are configured to provide the scanning control signals, and the data lines D are configured to provide the data signals. Optionally, the first direction X and the second direction Y are the two directions perpendicular to each other. The data lines D are arranged along the first direction X, and the scanning lines S are arranged along the second direction Y.

The liquid crystal display panel includes the drive circuit layer, and the drive circuit layer includes the substrate 11, the first metal layer M1 disposed on the substrate 11, the first insulating layer 12 covering the first metal layer M1, the second metal layer M2 disposed on the first insulating layer 12, and the second insulating layer 13 covering the second metal layer M2. Wherein, the first metal layer M1 and the second metal layer M2 are both film layers provided with metal wirings, the scanning lines S are located in the first metal layer M1, and the data lines D are located in the second metal layer M2.

The drive circuit layer also includes the thin film transistors. The gate electrode of the thin film transistors is positioned in the first metal layer M1 and is electrically connected to the scanning lines S. The source electrode and the drain electrode of the thin film transistors are positioned in the second metal layer M2, and the source electrode of the thin film transistors is electrically connected to the data lines D.

The liquid crystal display panel further includes the pixel electrode P disposed on the drive circuit layer, and the pixel electrode P is electrically connected to the second metal layer M2 by the through-hole K. Specifically, the pixel electrode P is electrically connected to the drain electrode of the thin film transistors by the through-hole K. The scanning signals provided by the scanning lines S control the source electrode and the drain electrode of the thin film transistors to be conducted to each other, and the data signals provided by the data lines D to the source electrode are transmitted to the pixel electrode P by the source electrode and the drain electrode, thereby allowing the pixel electrode P to generate the specific electric field effect.

The pixel electrode P includes the first main trunk electrode P1 extending along the first direction X and the second main trunk electrode P2 extending along the second direction Y. The first main trunk electrode P1 and the second main trunk electrode P2 are connected crosswise to form the pixel electrode sub-areas. Each of the pixel electrode sub-areas includes the branch electrodes, and the branch electrodes and the first main trunk electrode P1 or the second main trunk electrode P2 have the certain tilt angle, thereby allowing the pixel electrode P to have the pozidriv structure.

Taking the intersection of the first main trunk electrode P1 and the second main trunk electrode P2 as the boundary, the second main trunk electrode P2 may be divided into the upper electrode and the lower electrode. The upper electrode is adjacent to the through-hole K, and the lower electrode is farther away from the through-hole K than the upper electrode.

The liquid crystal display panel further includes the shielding member Z, which is a second shielding metal M21 positioned in the second metal layer M2, and the second shielding metal M21 is electrically insulated from the data lines D and other wirings in the second metal layer M2. The second shielding metal M21 may be manufactured in a same process that patterns the second metal layer M2, and the second shielding metal M21 is allowed to be disconnected to other metal wirings in the second metal layer M2.

The shielding member Z is disposed corresponding to the upper electrode, and the orthographic projection of the shielding member Z on the pixel electrode P coincides with the upper electrode. Therefore, the light emitted from the liquid crystal display panel corresponding to the upper electrode can be shielded by the shielding member Z, thereby eliminating the afterimage defects appeared in this area.

Further, the shielding member Z is parallel to the data lines D and is positioned between the two adjacent data lines D.

Optionally, the shielding member Z may be disposed corresponding to the upper electrode and the lower electrode, and the orthographic projection of the shielding member Z on the pixel electrode P coincides with the upper electrode and the lower electrode.

Further, the shielding member Z is disposed corresponding to the second main trunk electrode P2, and the orthographic projection of the shielding member Z on the pixel electrode P coincides with the second main trunk electrode P2. Therefore, the light emitted from the liquid crystal display panel corresponding to the second main trunk electrode P2 can be completely shielded by the shielding member Z, thereby eliminating the afterimage defects appeared in this area.

Figure 6:
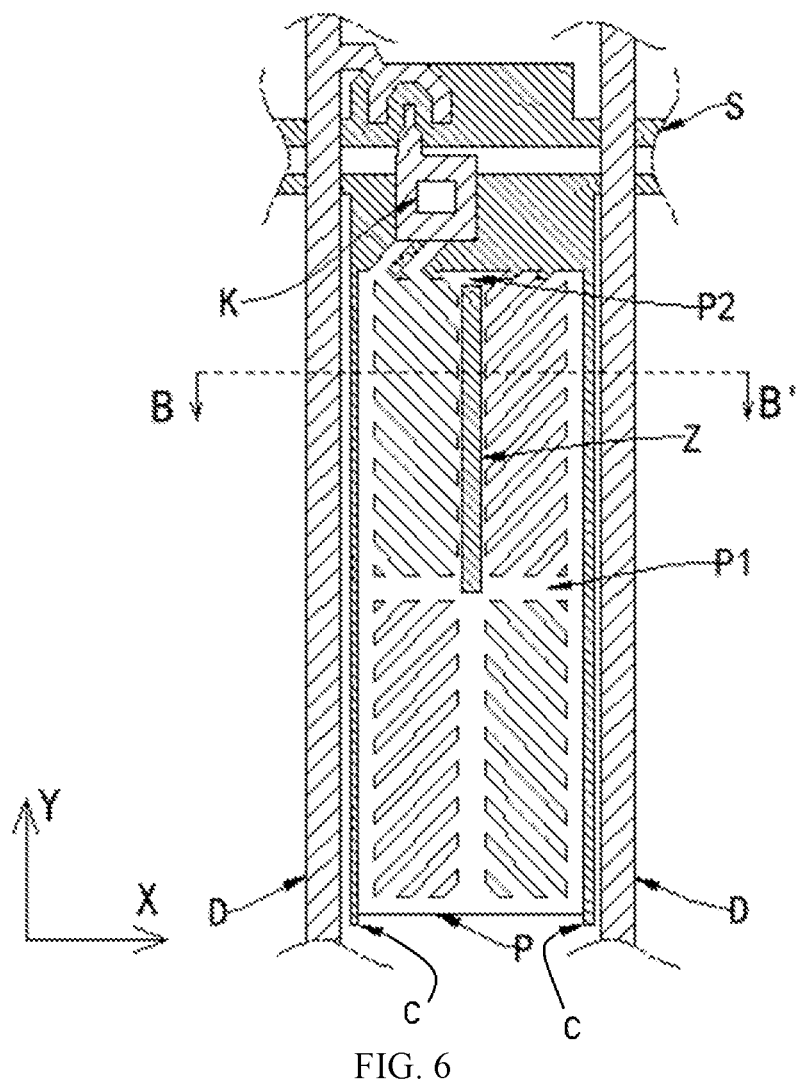
FIG. 6 is a perspective view of the single pixel electrode area of the liquid crystal display panel according to a fourth embodiment of the present disclosure.
Figure 7:
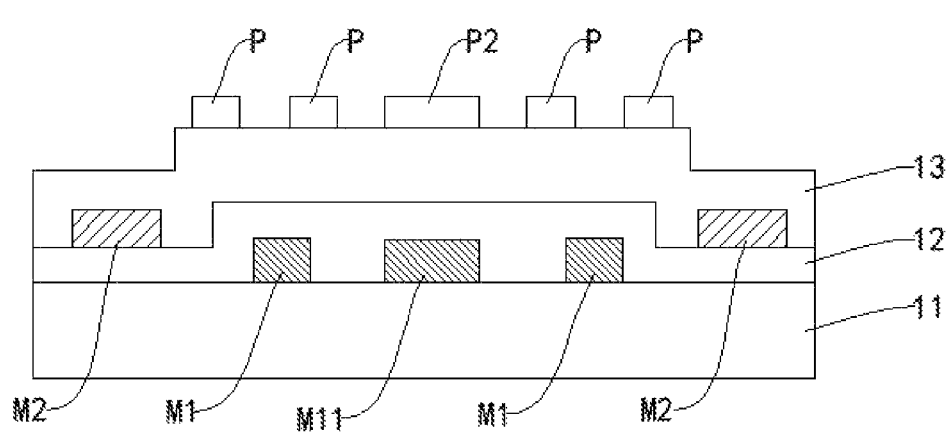
FIG. 7 is a schematic cross-sectional structural diagram of the liquid crystal display panel shown in FIG. 6 along line B-B'.

In an embodiment, referring to FIGS. 6 and 7, FIG. 6 is a perspective view of the single pixel electrode area of the liquid crystal display panel according to a fourth embodiment of the present disclosure, and FIG. 5 is a schematic cross-sectional structural diagram of the liquid crystal display panel shown in FIG. 6 along line B-B'. Wherein, the perspective view of FIG. 6 only shows the scanning lines, the data lines, the pixel electrode, and the shielding member included in the liquid crystal display panel, so as to illustrate the relative positional relationships between them.

The liquid crystal display panel shown in FIG. 6 and the liquid crystal display panel shown in FIG. 1 have same or similar structures. Structural features of the liquid crystal display panel shown in FIG. 6 will be described below. For the parts that are not described in detail, please refer to the description of the liquid crystal display panel shown in FIG. 1 above.

The liquid crystal display panel includes the scanning lines S extending along the first direction X and the data lines D extending along the second direction Y. The scanning lines S are configured to provide the scanning control signals, and the data lines D are configured to provide the data signals. Optionally, the first direction X and the second direction Y are the two directions perpendicular to each other. The data lines D are arranged along the first direction X, and the scanning lines S are arranged along the second direction Y.

The liquid crystal display panel includes the drive circuit layer, and the drive circuit layer includes the substrate 11, the first metal layer M1 disposed on the substrate 11, the first insulating layer 12 covering the first metal layer M1, the second metal layer M2 disposed on the first insulating layer 12, and the second insulating layer 13 covering the second metal layer M2. Wherein, the first metal layer M1 and the second metal layer M2 are both film layers provided with metal wirings, the scanning lines S are located in the first metal layer M1, and the data lines D are located in the second metal layer M2.

The drive circuit layer also includes the thin film transistors. The gate electrode of the thin film transistors is positioned in the first metal layer M1 and is electrically connected to the scanning lines S. The source electrode and the drain electrode of the thin film transistors are positioned in the second metal layer M2, and the source electrode of the thin film transistors is electrically connected to the data lines D.

The liquid crystal display panel further includes the pixel electrode P disposed on the drive circuit layer, and the pixel electrode P is electrically connected to the second metal layer M2 by the through-hole K. Specifically, the pixel electrode P is electrically connected to the drain electrode of the thin film transistors by the through-hole K. The scanning signals provided by the scanning lines S control the source electrode and the drain electrode of the thin film transistors to be conducted to each other, and the data signals provided by the data lines D to the source electrode are transmitted to the pixel electrode P by the source electrode and the drain electrode, thereby allowing the pixel electrode P to generate the specific electric field effect.

The pixel electrode P includes the first main trunk electrode P1 extending along the first direction X and the second main trunk electrode P2 extending along the second direction Y. The first main trunk electrode P1 and the second main trunk electrode P2 are connected crosswise to form the pixel electrode sub-areas. Each of the pixel electrode sub-areas includes the branch electrodes, and the branch electrodes and the first main trunk electrode P1 or the second main trunk electrode P2 have the certain tilt angle, thereby allowing the pixel electrode P to have the pozidriv structure.

Taking the intersection of the first main trunk electrode P1 and the second main trunk electrode P2 as the boundary, the second main trunk electrode P2 may be divided into the upper electrode and the lower electrode. The upper electrode is adjacent to the through-hole K, and the lower electrode is farther away from the through-hole K than the upper electrode.

The liquid crystal display panel further includes the shielding member Z, which is a first shielding metal M11 positioned in the first metal layer M1, and the first shielding metal M11 is electrically insulated from the scanning lines S and other wirings in the first metal layer M1. The first shielding metal M11 may be manufactured in a same process that patterns the first metal layer M1, and the first shielding metal M11 is allowed to be disconnected to other metal wirings in the first metal layer M1.

The shielding member Z is disposed corresponding to the upper electrode, and the orthographic projection of the shielding member Z on the pixel electrode P coincides with the upper electrode. Therefore, the light emitted from the liquid crystal display panel corresponding to the upper electrode can be shielded by the shielding member Z, thereby eliminating the afterimage defects appeared in this area.

Further, the shielding member Z is parallel to the data lines D and is positioned between the two adjacent data lines D.

Optionally, the shielding member Z may be disposed corresponding to the upper electrode and the lower electrode, and the orthographic projection of the shielding member Z on the pixel electrode P coincides with the upper electrode and the lower electrode.

Further, the shielding member Z is disposed corresponding to the second main trunk electrode P2, and the orthographic projection of the shielding member Z on the pixel electrode P coincides with the second main trunk electrode P2. Therefore, the light emitted from the liquid crystal display panel corresponding to the second main trunk electrode P2 can be completely shielded by the shielding member Z, thereby eliminating the afterimage defects appeared in this area.

Figure 8:
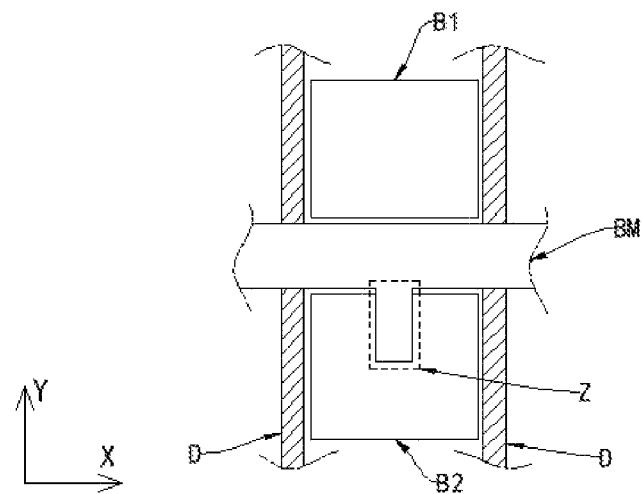
FIG. 8 is a partial perspective view of a color resist layer of the liquid crystal display panel according to a fifth embodiment of the present disclosure.
Figure 9:
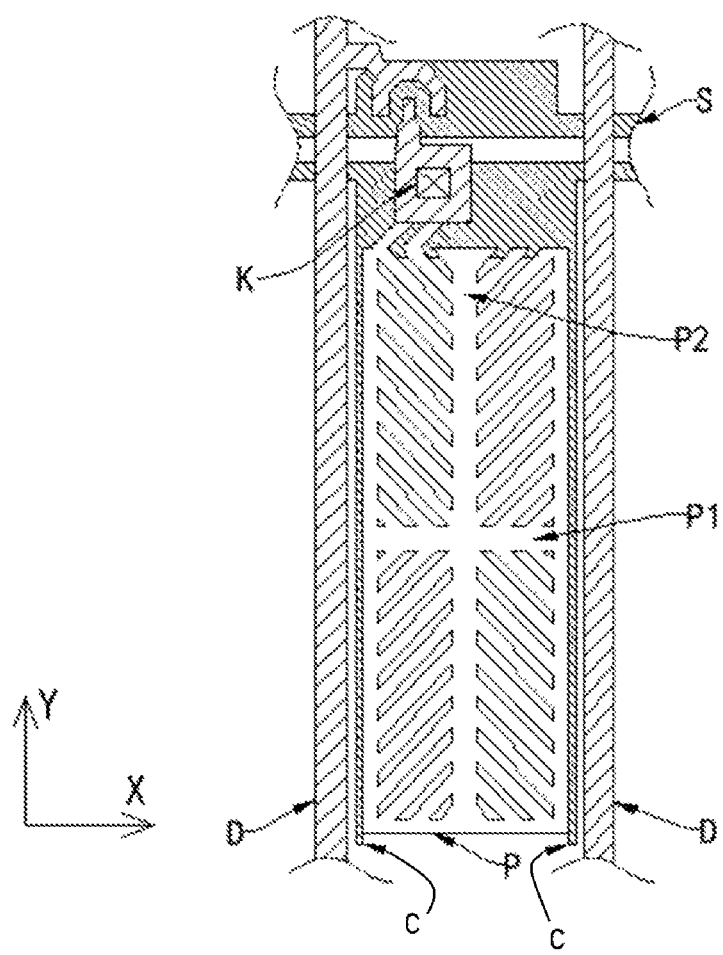
FIG. 9 is a perspective view of the single pixel electrode area of the liquid crystal display panel according to the fifth embodiment of the present disclosure.

In an embodiment, referring to FIGS. 8 and 9, FIG. 8 is a partial perspective view of a color resist layer of the liquid crystal display panel according to a fifth embodiment of the present disclosure, and FIG. 9 is a perspective view of the single pixel electrode area of the liquid crystal display panel according to the fifth embodiment of the present disclosure. Wherein, the perspective view of FIG. 8 only shows the data lines, color resists, and a light-shielding layer included in the liquid crystal display panel, and the perspective view of FIG. 9 only shows the scanning lines, the data lines, and the pixel electrode included in the liquid crystal display panel.

The liquid crystal display panel shown in FIGS. 8 and 9 and the liquid crystal display panel shown in FIG. 1 have same or similar structures. Structural features of the liquid crystal display panel shown in FIGS. 8 and 9 will be described below. For the parts that are not described in detail, please refer to the description of the structure of the liquid crystal display panel shown in FIG. 1 above.

The liquid crystal display panel includes the scanning lines S extending along the first direction X and the data lines D extending along the second direction Y. The scanning lines S are configured to provide the scanning control signals, and the data lines D are configured to provide the data signals. Optionally, the first direction X and the second direction Y are the two directions perpendicular to each other. The data lines D are arranged along the first direction X, and the scanning lines S are arranged along the second direction Y.

The liquid crystal display panel further includes the drive circuit layer, and the drive circuit layer includes the first metal layer and the second metal layer. The first metal layer and the second metal layer are both film layers provided with metal wirings, the scanning lines S are located in the first metal layer, and the data lines D are located in the second metal layer.

The drive circuit layer also includes the thin film transistors. The gate electrode of the thin film transistors is positioned in the first metal layer and is electrically connected to the scanning lines S. The source electrode and the drain electrode of the thin film transistors are positioned in the second metal layer, and the source electrode of the thin film transistors is electrically connected to the data lines D.

The liquid crystal display panel further includes the pixel electrode P disposed on the drive circuit layer, and the pixel electrode P is electrically connected to the second metal layer by the through-hole K. The pixel electrode P includes the first main trunk electrode P1 extending along the first direction X and the second main trunk electrode P2 extending along the second direction Y. The first main trunk electrode P1 and the second main trunk electrode P2 are connected crosswise to form the pixel electrode sub-areas. Each of the pixel electrode sub-areas includes the branch electrodes, and the branch electrodes and the first main trunk electrode P1 or the second main trunk electrode P2 have the certain tilt angle, thereby allowing the pixel electrode P to have the pozidriv structure.

Taking the intersection of the first main trunk electrode P1 and the second main trunk electrode P2 as the boundary, the second main trunk electrode P2 may be divided into the upper electrode and the lower electrode. The upper electrode is adjacent to the through-hole K, and the lower electrode is farther away from the through-hole K than the upper electrode.

The liquid crystal display panel further includes the color resists in the color resist layer, and the color resists are disposed corresponding to the pixel electrodes P by one to one. The color resists include a first color resist B1 and a second color resist B2 arranged adjacent to each other along the second direction Y, and the light-shielding layer BM is disposed between the first color resist B1 and the second color resist B2. The light-shielding layer BM is an opaque structure and is configured to prevent light emitted from the first color resist B1 and light emitted from the second color resist B2 from interfering with each other.

The liquid crystal display panel also includes the shielding member Z disposed in a same layer as the light-shielding layer BM. The shielding member Z may be connected to the light-shielding layer BM and be manufactured by a same material and a same process as the light-shielding layer BM to become a part of the light-shielding layer BM. At this time, the shielding member Z is perpendicular to the light-shielding layer BM, and the light-shielding layer BM and the shielding member Z are combined to form a T-shaped light-shielding structure.

Optionally, the shielding member Z may also be an independent component separated from the light-shielding layer BM, and at this time, the shielding member Z may be manufactured by the same process as the light-shielding layer BM or may be manufactured by other process.

The shielding member Z is disposed corresponding to the upper electrode, the width of the shielding member Z is greater than or equal to the width of the upper electrode, and the orthographic projection of the shielding member Z on the pixel electrode P coincides with the upper electrode. Therefore, the light emitted from the liquid crystal display panel corresponding to the upper electrode can be shielded by the shielding member Z, thereby eliminating the afterimage defects appeared in this area.

Further, the shielding member Z is parallel to the data lines D and is positioned between the two adjacent data lines D.

Optionally, the shielding member Z may be disposed corresponding to the upper electrode and the lower electrode, and the orthographic projection of the shielding member Z on the pixel electrode P coincides with the upper electrode and the lower electrode.

Further, the shielding member Z is disposed corresponding to the second main trunk electrode P2, and the orthographic projection of the shielding member Z on the pixel electrode P coincides with the second main trunk electrode P2. Therefore, the light emitted from the liquid crystal display panel corresponding to the second main trunk electrode P2 can be completely shielded by the shielding member Z, thereby eliminating the afterimage defects appeared in this area and improving the display quality of the liquid crystal display panel.

Figure 10:
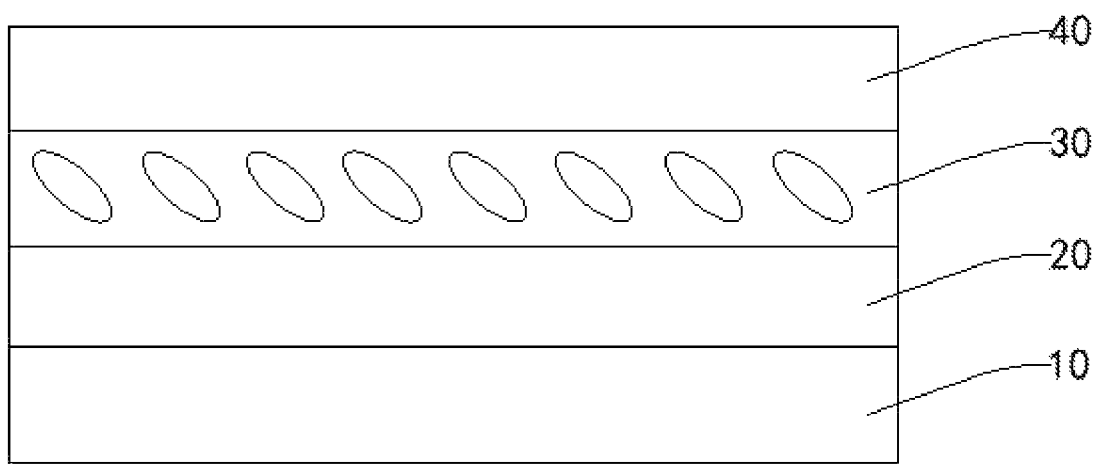
FIG. 10 is a schematic structural diagram of the liquid crystal display panel according to an embodiment of the present disclosure.

Further, referring to FIGS. 8 to 10, wherein, FIG. 10 is a schematic structural diagram of the liquid crystal display panel according to an embodiment of the present disclosure. The liquid crystal display panel includes a backlight module 10, an array substrate 20 disposed on a light-emitting surface of the backlight module 10, a color filter substrate 40 disposed opposite to the array substrate 20, and liquid crystals 30 disposed between the array substrate 20 and the color filter substrate 40. The backlight module 10 is configured to provide light sources for the liquid crystal display panel.

The array substrate 20 includes the drive circuit layer and the pixel electrodes P, and the pixel electrodes P are disposed on one side of the drive circuit layer adjacent to the liquid crystals 30. The color filter substrate 40 includes the color resists and a common electrode C, the common electrode C is disposed on one side of the color resists adjacent to the liquid crystals 30, and the color resists correspond to the pixel electrodes P by one to one. The liquid crystals 30 deflect at different angles under electric fields provided by the pixel electrodes P and the common electrode C together, thereby allowing the liquid crystal display panel to have display effect with various grayscales.

In the embodiments of the present disclosure, a part of light emitted from the backlight module 10 is shielded by the shielding member Z and cannot be emitted from the light-emitting surface of the liquid crystal display panel. Therefore, an area of the liquid crystal display panel corresponding to the shielding member Z can be always in a non-display state, thereby eliminating the afterimage defects appeared in this area and improving the display quality of the liquid crystal display panel.

In summary, the liquid crystal display panel provided by the embodiments of the present disclosure includes the drive circuit layer and the pixel electrodes disposed on the drive circuit layer. The drive circuit layer includes the first metal layer and the second metal layer, each of the pixel electrodes is electrically connected to the second metal layer by the through-hole and includes the second main trunk electrode, and the second main trunk electrode includes the upper electrode adjacent to the through-hole. The liquid crystal display panel further includes the shielding member for shielding a display area where the upper electrode is located. The present disclosure disposes the shielding member to shield light in the display area corresponding to the upper electrode of the liquid crystal display panel, which allows afterimages in the display area corresponding to the upper electrode not to be shown. Therefore, the afterimage defects in this area can be eliminated, and the display quality of the liquid crystal display panel can be improved.

An embodiment of the present disclosure further provides a liquid crystal display device. The liquid crystal display device includes the liquid crystal display panel provided in the embodiments of the present disclosure. The liquid crystal display device may be a device having a display function such as a mobile phone, a notebook computer, a tablet computer, a television, a navigator, etc.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A liquid crystal display panel, comprising a plurality of scanning lines extending along a first direction and a plurality of data lines extending along a second direction, and further comprising:
 a drive circuit layer comprising a first metal layer and a second metal layer;
 a plurality of pixel electrodes disposed on the drive circuit layer, wherein each of the pixel electrodes is electrically connected to the second metal layer by a through-hole and comprises a first main trunk electrode and a second main trunk electrode, and the second main trunk electrode comprises an upper electrode adjacent to the through-hole;
 a shielding member, wherein an orthographic projection of the shielding member on the pixel electrodes coincides with the upper electrode;
 a plurality of color resists corresponding to the pixel electrodes one to one;
 wherein the color resists comprise a first color resist and a second color resist arranged adjacent to each other along the second direction, a light-shielding layer is disposed between the first color resist and the second color resist, and the shielding member is disposed in a same layer as the light-shielding layer; and
 wherein a width of the shielding member is greater than or equal to a width of the second main trunk electrode.

2. The liquid crystal display panel according to claim 1, wherein the first metal layer comprises the scanning lines; and
 the shielding member comprises a first shielding metal positioned in the first metal layer.

3. The liquid crystal display panel according to claim 2, wherein the first shielding metal is insulated from the scanning lines.

4. The liquid crystal display panel according to claim 1, wherein the second metal layer comprises the data lines; and
 the shielding member comprises a shielding metal positioned in the second metal layer.

5. The liquid crystal display panel according to claim 4, wherein the shielding metal is insulated from the data lines.

6. The liquid crystal display panel according to claim 1, wherein the shielding member is connected to the light-shielding layer.

7. The liquid crystal display panel according to claim 1, wherein a width of the shielding member is greater than or equal to a width of the upper electrode.

8. The liquid crystal display panel according to claim 1, wherein the shielding member is perpendicular to the light-shielding layer.

9. The liquid crystal display panel according to claim 8, wherein the light-shielding layer and the shielding member are combined to form a T-shaped light-shielding structure.

10. The liquid crystal display panel according to claim 1, wherein the second main trunk electrode further comprises a lower electrode away from the through-hole, and the lower electrode is electrically connected to the upper electrode; and
 a projection of the shielding member on the pixel electrodes along a direction perpendicular to a plane that the pixel electrodes are located coincides with the lower electrode.

11. The liquid crystal display panel according to claim 10, wherein a width of the shielding member is greater than or equal to a width of the lower electrode.

12. The liquid crystal display panel according to claim 1, wherein the shielding member is parallel to the data lines.

13. The liquid crystal display panel according to claim 12, wherein the shielding member is positioned between two adjacent data lines.

14. The liquid crystal display panel according to claim 1, wherein the shielding member is perpendicular to the scanning lines.

15. The liquid crystal display panel according to claim 14, wherein the shielding member is positioned between two adjacent scanning lines.

16. The liquid crystal display panel according to claim 1, wherein each of the pixel electrodes further comprises a plurality of branch electrodes, and the branch electrodes, the first main trunk electrode, and the second main trunk electrode form a pozidriv structure.

17. The liquid crystal display panel according to claim 1, comprising an array substrate, a color filter substrate disposed opposite to the array substrate, and liquid crystals disposed between the array substrate and the color filter substrate;
   wherein the array substrate comprises the drive circuit layer and the pixel electrodes, and the pixel electrodes are disposed on one side of the drive circuit layer adjacent to the liquid crystals.

18. The liquid crystal display panel according to claim 17, wherein the color filter substrate comprises color resists and a common electrode, the common electrode is disposed on one side of the color resists adjacent to the liquid crystals, and the color resists correspond to the pixel electrodes by one to one.

19. A liquid crystal display panel, comprising an array substrate, a color filter substrate disposed opposite to the array substrate, and liquid crystals disposed between the array substrate and the color filter substrate;
   wherein the array substrate comprises:
      a drive circuit layer comprising a first metal layer and a second metal layer, wherein the first metal layer comprises a plurality of scanning lines extending along a first direction, and the second metal layer comprises a plurality of data lines extending along a second direction;
      a plurality of pixel electrodes disposed on the drive circuit layer, wherein each of the pixel electrodes is electrically connected to the second metal layer by a through-hole and comprises a first main trunk electrode and a second main trunk electrode, and the second main trunk electrode is parallel to the data lines;
      a shielding member disposed in the first metal layer or the second metal layer, wherein an orthographic projection of the shielding member on the pixel electrodes coincides with the second main trunk electrode;
      a plurality of color resists corresponding to the pixel electrodes by one to one;
   wherein the color resists comprise a first color resist and a second color resist arranged adjacent to each other along the second direction, a light-shielding layer is disposed between the first color resist and the second color resist, and the shielding member is disposed in a same layer as the light-shielding layer; and
   wherein a width of the shielding member is greater than or equal to a width of the second main trunk electrode.

* * * * *